United States Patent [19]
Reynolds

[11] Patent Number: 6,106,690
[45] Date of Patent: Aug. 22, 2000

[54] ELECTROPLANER

[75] Inventor: H. Vincent Reynolds, Marcellus, N.Y.

[73] Assignee: Reynolds Tech Fabricators, Inc., East Syracuse, N.Y.

[21] Appl. No.: 09/206,728

[22] Filed: Dec. 7, 1998

[51] Int. Cl.[7] .............................. B23H 3/00; B23H 7/26; B23H 11/00
[52] U.S. Cl. ..................... 205/669; 205/670; 205/672; 205/686; 204/224 M; 204/225
[58] Field of Search .................... 205/669, 672, 205/686, 670; 204/224 M, 225

[56] References Cited

U.S. PATENT DOCUMENTS

| | | | |
|---|---|---|---|
| 2,763,608 | 9/1956 | Pool | 205/669 |
| 4,222,834 | 9/1980 | Bacon et al. | 205/669 |
| 5,865,984 | 2/1999 | Corbin, Jr. et al. | 205/672 X |

Primary Examiner—Donald R. Valentine
Attorney, Agent, or Firm—Trapani & Molldrem

[57] ABSTRACT

An electroplaning technique achieves superior flatness of the face of a wafer. A chuck holds the wafer so the face of the wafer is oriented downwards and lowers it to an electroplaner stage. The electroplaner includes an elongated, horizontally extending cup, an elongated horizontally extending nozzle within it. Electrolyte flows non-turbulently from an upper side of the nozzle to create a meniscus of electrolyte that contacts the wafer. The electroplaner moves transversely while the chuck is held steady so that said meniscus sweeps across the face of said wafer. A rinser of similar construction likewise has a meniscus or rinse that sweeps across the wafer. The nozzle can have a row of openings along its upper side, or may be formed at least in part of a microporous material. The wafer is electrically configured as cathode.

9 Claims, 2 Drawing Sheets

ELECTROPLANER

BACKGROUND OF THE INVENTION

This invention relates to wet process chemistry treatment of substrates, e.g., semiconductor wafers and the like, and is more particularly directed to a technique for planing or etching the surface of a flat workpiece so that it is left uniformly flat across the surface. The invention also concerns a technique that facilitates employment of robotic handling of the articles to be planed e.g. between plating steps.

Electroplating plays a significant role in the production of many rather sophisticated technology products, such as masters and stampers for use in producing digital compact discs or in the manufacturing of advanced semiconductor wafers. However, as these products have become more and more sophisticated, the tolerances of the plating process have become narrower and narrower. Current plans to increase the circuit density of silicon wafers are being thwarted by the inability of plating techniques to control unevenness in the plating process, and especially in the axial direction.

It is the current practice to employ an electrolytic etch technique to remove a surface layer from a wafer, for example after a plating step. In this technique, the wafer is held vertically, i.e, in a vertical or nearly vertical plane, and is sprayed or injected with an etchant electrolytic solution. There can be a cathode for applying an electric current across the solution to the surface of the wafer. The electrolyte then runs down the front of the wafer and drips off from the bottom edge. This creates a conductivity path through the electrolyte back to the cathode. Thus in this arrangement, even if the electrolyte does remove the material evenly at the point where the electrolyte is sprayed on, metallization can be uneven below that point. The planing is less than optimal. Also, any particles that may become entrained in the electrolyte continue down the face of the wafer and can deposit on other parts of the wafer. While it would be an improvement to hold the wafer horizontally and spray the electrolyte onto the horizontal wafer, it has not been possible to spray the electrolyte onto a horizontal surface and then collect it again. Thus a technique to produce a truly flat electro-planed workpiece has eluded the industry.

OBJECTS AND SUMMARY OF THE INVENTION

Accordingly, it is an object of this invention to provide an electroplaner arrangement which reliably removes material from a wafer without unevenness, and which avoids the drawbacks of the prior art.

It is another object of this invention to provide an electroplaner which can be adapted easily to an automated wafer handling mechanism, and which can be automated as to the loading or unloading of the wafer.

According to one aspect of the present invention, a planar face of a substrate has been subjected to a surface treatment, e.g., plated with a metal layer, and the top portion of the plating is to be removed, i.e., planed. An electroplaner comprises an elongated horizontally extending cup having an open top, an elongated horizontally extending nozzle within the cup, and a supply conduit that supplies an electrolyte to the nozzle. The nozzle creates a meniscus of the electrolyte in the cup that can contact a substrate above it. In order to plane the surface of the substrate, the substrate, e.g., wafer, is placed in a chuck. The chuck is rotated to orient the wafer horizontal and face down. Then the chuck is lowered to a level at which the meniscus contacts the face of the substrate. Then the electroplaner is moved horizontally, thus effecting relative motion between the substrate and the electroplaner so that said meniscus sweeps across the face of said substrate. Alternatively, the cathode can be a conductive rod within the nozzle. The nozzle can be in the form of a tubular finger and can serve as the cathode, whereby an electrical current is applied across the meniscus between the electroplaner and the substrate. The tubular nozzle preferably has opening(s) arranged on an upward side thereof, such that the electrolyte can flow non-turbulently from an interior of the nozzle through the openings into the meniscus. The electrolyte is drained from the cup and is filtered and processed.

Alongside the electroplaner there is preferably a rinser that includes an elongated horizontally extending cup having an open top, a horizontally extending nozzle within the cup, and means supplying a rinse liquid (e.g., de-ionized water) to the rinser nozzle to create a meniscus of the rinse liquid. The rinser is positioned so that the substrate, when oriented to contact the electrolyte meniscus of the electroplaner, also will contact the rinse liquid meniscus. The rinser moves transversely with the electroplaner, so that when the electroplaner is moved across the face of the substrate, the same motion also sweeps the meniscus of rinse liquid behind it across the face of the substrate. The rinse liquid can be conducted from the rinser cup to a drain or a discharge holding tank.

After the electroplaning operation, the chuck is lifted and then rotated so that the wafer is oriented face upwards. Then with a robotic arm or other automated means, the wafer is transported to a subsequent station.

The above and many other objects, features, and advantages of this invention will become more fully appreciated from the ensuing detailed description of a preferred embodiment, which is to be considered in conjunction with the accompanying Drawing.

DETAILED DESCRIPTION OF THE PREFERRED EMBODIMENT

Figure 1:
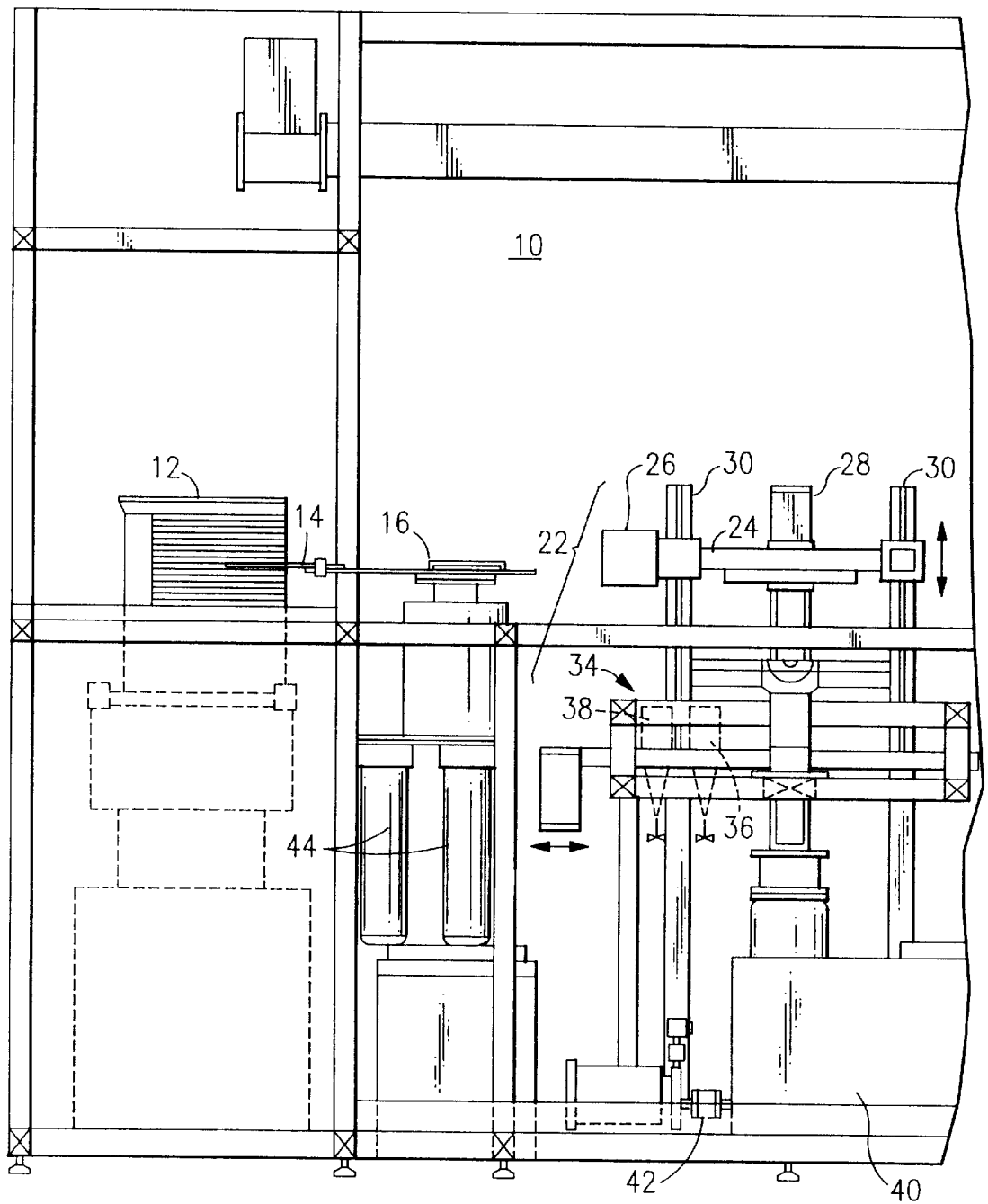
FIG. 1 is a partial elevation of a semiconductor wafer wet process arrangement, with an electroplaner arrangement for carrying out the planing process according to one preferred embodiment of this invention.
Figure 2:
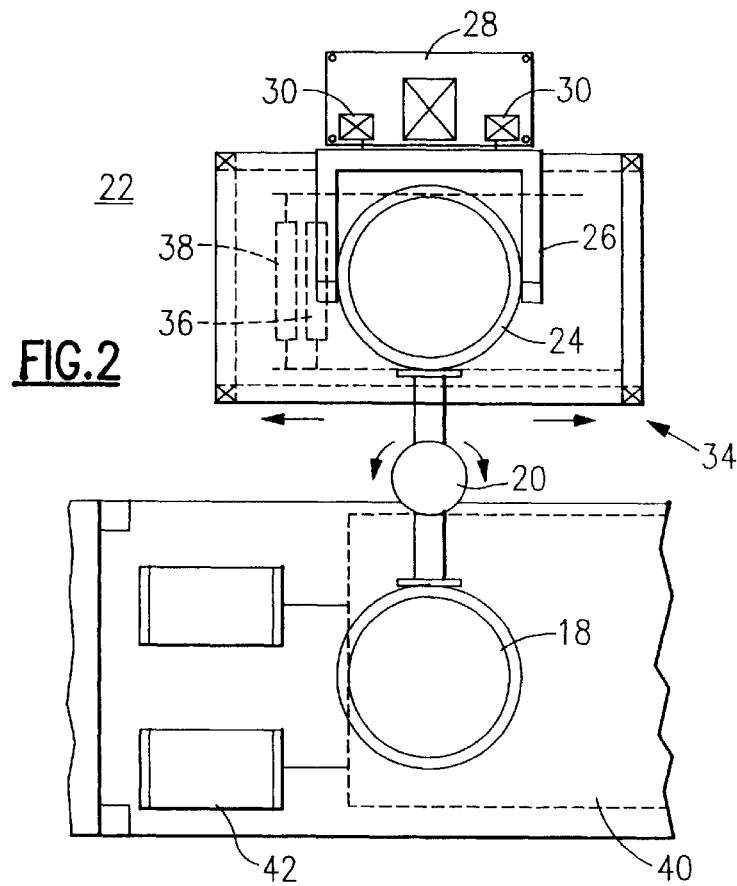
FIG. 2 is a top plan view of a portion of this embodiment.

A wet chemistry process arrangement 10 according to an embodiment of this invention is illustrated in FIGS. 1 and 2. Here the arrangement 10 can have a cabinet, with a clean air system and automatic wafer handling equipment so that the wet process steps, and possibly other process steps, are carried out automatically for a number of wafers or other workpieces in sequence. As shown in the left part of FIG. 1, a wafer stacker 12 is located in a load station and contains a batch of wafers 14, i.e., slices of semiconductor crystal, on which some processing, i.e., circuit integration, has already taken place. In this case, this involves metallization, and a planing step is required. A loader mechanism 16, here shown as a robotic arm, picks up a wafer 14 from the stacker 12 and transfers the wafer, face-up, to a process station. While this station can be for plating, cleaning, etching or some other step, in this example the station is illustrated as an electroplaning station.

As shown in FIG. 2, the loader 16 hands the wafer off to a transfer station 18, where the wafer 14 is taken by a rotary transfer arm 20 to an electroplaning station 22, shown in plan in FIG. 2. The wafer 14 is laid upon a vacuum plate of a chuck 24. The chuck is mounted on a carriage 26 that permits 180-degree rotation of the chuck, to orient the wafer 14 face down. An elevator 28 moves the carriage 26 vertically along guide rails 30, 30 between the elevated position (for transfer of the wafer 14) and a lowered position (for electroplaning of the wafer 14).

Beneath the chuck 24 is a process stage 34, where an electroplaner 36 and a rinser 38 are located. The electroplaner 36 and rinser 38 are elongated baths that lie tangent to the face or front surface of the wafer 14 when the chuck 24 is in the inverted and lowered position. Also shown is a motor 39 for effecting transverse horizontal motion of the electroplaner and rinser, along guide rails, across the surface of the wafer. In this embodiment, the chuck is held steady during the electroplaning process. In other possible embodiments, the chuck could be moved laterally past a stationary rinser and electroplaner. FIG. 1 also shows a chemical holding tank 40 for holding the electrolyte used for electroplaning and for containing de-ionized water or other rinse liquid, and a pump 42 for feeding the electrolyte and rinse liquid to the electroplaner 36 and rinser 38. Filters 44 are provided for the process chemicals that are returned from the electroplaner 36 to the tank 40.

Figure 3:
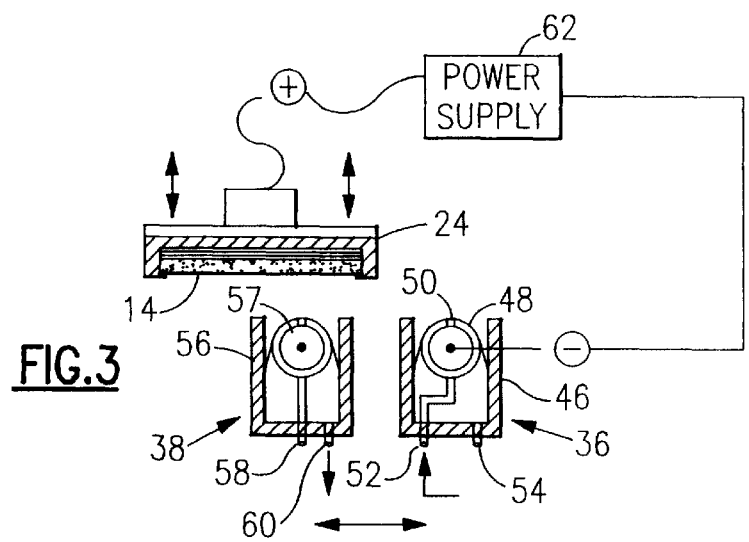
FIGS. 3 and 4 are cross sectional schematic views of the electroplaner and rinser for explaining the operation of this embodiment.
Figure 4:
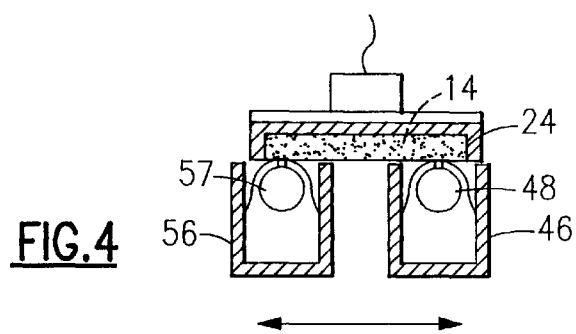

As shown in more detail in the schematic cross-sections of FIGS. 3 and 4, the electroplaner 36 comprises a cup 46 in the form of an elongated tray or basin, formed of a durable non-reactive, non-conductive material such as polypropylene. The cup is elongated in the horizontal direction, and has an open top. A nozzle 48 is situated in the cup 46 and extends longitudinally the length of the cup. The nozzle 48 is in the form of a tubular hollow finger or wand, with a row of openings 50 at its top to permit a laminar, i.e., non-turbulent flow of the electrolyte out over the top surface of the nozzle 48 into the cup 46. The openings 50 can be holes or slits, or can be pores or foramina. The electrolyte forms a meniscus over the nozzle. The meniscus is in the form or a raised ridge of fluid above the nozzle and extending the length thereof. In this case, the nozzle and meniscus are long enough to exceed the entire diameter of the wafer. Also shown here is a supply conduit 52 connecting the pump 42 to the nozzle 48 and a return conduit 54 leading from the cup back, e.g., to the filters 44.

The rinser 38 is of similar construction and is located adjacent and parallel to the electroplaner 36. The rinser 38 comprises a cup 56, in the form of an elongated, open-top tray, and can be of the same material as the electroplaner cup. An elongated nozzle 57 is disposed along the length of the cup 56 and has a rinse supply conduit 58 supplying the nozzle with de-ionized water or another rinse liquid. A drain conduit 60 leads from the cup 56 to a drain or waste reservoir (not shown). The rinse liquid flows non-turbulently over the upper surface of the nozzle 57 and forms a meniscus.

As shown schematically, an electrical power supply has a positive lead (+) connected to the chuck 24 which is in turn electrically coupled to the front surface of the wafer 14. The supply 62 also has a negative lead (−) connected to a cathode 64, here shown located inside the electroplaner nozzle 48. In other embodiments, the electroplaner nozzle can be made of conductive material and can itself serve as cathode.

Instead of a row of openings 50, the nozzle 48 can be provided with a slit or a series of slits, or else the nozzle can be made of a microporous material so that the electrolyte weeps through. Still other configurations are possible within the scope of this invention.

The electroplaning process of this embodiment involves first transferring the wafer 14, face up, from the transfer station 18 to the chuck 24, where vacuum is applied to hold the wafer in place. Then the chuck is inverted on the carrier 26, so that the wafer 14 is disposed horizontally and face down. The chuck 24 is moved vertically to its lowered position adjacent the electroplaning stage 34, so that the meniscuses of the electroplaner and rinser are tangent to the face of the wafer. Then the electroplaner 36 and rinser 38 are moved horizontally below the chuck so that the meniscuses sweep across the face of the wafer 14. When this happens, the electroplaner meniscus contacts the wafer only along a horizontal line of contact, and the electrolyte does not flow to other areas of the wafer face. Likewise, the rinser meniscus contacts the wafer only along a line of contact. The planing and rinse are carried out non-turbulently and only along well defined zones of contact, resulting in extreme evenness and a high level of repeatability from one wafer to the next.

The planing operation can require one pass or more than one pass, as required by the materials and chemistry involved.

After the electroplaning is complete, the chuck 24 and carriage 26 are raised to their elevated position, and the chuck is rotated 180 degrees to orient the wafer face up. Then the transfer arm 20 transports the wafer 14 to the transfer station 18, where it is conveyed to a subsequent process stage. The wafers so processed are eventually transported to a wafer stacker in an unload station (not shown), where the processed wafers are removed from the wet process arrangement 10.

In some alternative embodiments, a megasonic transducer can be incorporated in either the electroplaner, or the rinser, or both.

While the invention has been described with reference to a preferred embodiment, it should be recognized that the invention is not limited to that precise embodiment, or to the variations herein described. Rather, many modifications and variations would present themselves to persons skilled in the art without departing from the scope and spirit of the invention, as defined in the appended claims.

What is claimed is:

1. A method of electroplaning a face of a flat substrate with an electroplaner that includes an elongated horizontally extending cup having an open top, an elongated horizontally extending nozzle within said cup, and means supplying an electrolyte to said nozzle; the method comprising flowing said electrolyte from an upper side of said elongated horizontally extending nozzle so that the nozzle creates a meniscus of said electrolyte in said cup that can contact a substrate thereabove;

orienting said substrate horizontally and face down so that said meniscus contacts the face of said substrate; and effecting motion as between said substrate and said electroplaner so that said meniscus sweeps across the face of said substrate.

2. A method of electroplaning a face of a flat substrate with an electroplaner that includes an elongated horizontally extending cup having an open top, an elongated horizontally extending nozzle within said cup, and means supplying an electrolyte to said nozzle so that the nozzle creates a meniscus of said electrolyte in said cup that can contact a substrate thereabove; the method comprising orienting said substrate horizontally and face down so that said meniscus contacts the face of said substrate;

effecting motion as between said substrate and said electroplaner so that said meniscus sweeps across the face of said substrate; and applying an electrical current across said meniscus between said nozzle and said substrate.

3. A method of electroplaning a face of a flat substrate with an electroplaner that includes an elongated horizontally extending cup having an open top, an elongated horizontally extending nozzle within said cup, and means supplying an electrolyte to said nozzle so that the nozzle creates a meniscus of said electrolyte in said cup that can contact a substrate thereabove; the method comprising orienting said substrate horizontally and face down so that said meniscus contacts the face of said substrate; and effecting motion as between said substrate and said electroplaner so that said meniscus sweeps across the face of said substrate;

wherein said nozzle is in the form of a tubular finger having openings arranged on an upward side thereof, and further comprising flowing said electrolyte from an interior of said finger through said openings into the meniscus.

4. A method of electroplaning a face of a flat substrate with an electroplaner that includes an elongated horizontally extending cup having an open top, an elongated horizontally extending nozzle within said cup, and means supplying an electrolyte to said nozzle so that the nozzle creates a meniscus of said electrolyte in said cup that can contact a substrate thereabove; the method comprising orienting said substrate horizontally and face down so that said meniscus contacts the face of said substrate; and effecting motion as between said substrate and said electroplaner so that said meniscus sweeps across the face of said substrate;

in which the electroplaner further comprises a rinser that includes an elongated horizontally extending cup having an open top, a horizontally extending nozzle within the cup, and means supplying a rinse liquid to the rinser nozzle to create a meniscus of the rinse liquid; the rinser being positioned so that the substrate when oriented to contact the electrolyte meniscus of the electroplaner also contacts the rinse liquid meniscus; and said step of effecting motion also sweeps the meniscus of rinse liquid across the face of said substrate.

5. A electroplaner arrangement for planing the face of a wafer, comprising a chuck for holding a wafer horizontally with the face of the waver exposed and oriented downwards;

means for moving said chuck between a raised and a lowered position;

and electroplaner which includes an elongated horizontally extending cup, an elongated horizontally extending nozzle within said cup, and means supplying an electrolyte to said nozzle so that the nozzle creates a meniscus of said electrolyte that contacts said wafer when the chuck is in its lowered position; and means for effecting relative horizontal motion as between said electroplaner and said chuck so that said meniscus sweeps across the face of said wafer.

6. The electroplaner arrangement of claim 5 wherein said electroplaner nozzle has means permitting a non-turbulent flow of said electrolyte from an interior thereof to an upper side thereof.

7. The electroplaner arrangement of claim 6 wherein electroplaner nozzle has a row of openings along its upper side.

8. The electroplaner arrangement of claim 6 wherein electroplaner nozzle is formed at least in part of a microporous material.

9. The electroplaner arrangement of claim 5 further comprising electrical source means applying electrical power between said electroplaner and said wafer.

* * * * *